United States Patent [19]

Bache et al.

[11] Patent Number: 4,933,058
[45] Date of Patent: Jun. 12, 1990

[54] FORMATION OF HARD COATINGS ON CUTTING EDGES

[75] Inventors: Roger J. Bache; Colin J. Clipstone; Colin F. Parker; Joan Pumfrey, all of Reading, England

[73] Assignee: The Gillette Company, Boston, Mass.

[21] Appl. No.: 318,528

[22] Filed: Jan. 31, 1989

Related U.S. Application Data

[63] Continuation of Ser. No. 122,334, filed as PCT US87/00162 on Jan. 20, 1987, published as WO87/04471 on July 30, 1987, abandoned.

[51] Int. Cl.⁵ ............... C23C 14/34; C23C 16/00; B05D 3/06
[52] U.S. Cl. ............... 204/192.3; 204/192.15; 204/192.16; 204/192.22; 427/38; 427/249; 427/255.2; 427/255.3
[58] Field of Search ............... 204/192.12, 192.15, 204/192.16, 192.22, 192.31, 192.3; 427/37, 38, 249, 255.2, 255.3

[56] References Cited

U.S. PATENT DOCUMENTS

| | | | |
|---|---|---|---|
| 3,652,443 | 3/1972 | Fish | 204/298 |
| 3,740,327 | 6/1973 | Lane | 204/298 |
| 3,761,374 | 9/1973 | Bromer | 204/298 |
| 3,802,078 | 4/1974 | Denes | 204/192.15 |
| 3,829,969 | 8/1974 | Fischbein | 204/298 X |
| 3,911,579 | 10/1975 | Lane | 204/192.15 |
| 4,094,764 | 6/1978 | Boucher et al. | 204/298 |
| 4,116,791 | 9/1978 | Zega | 204/192.31 |
| 4,416,912 | 11/1983 | Bache | 427/13 |
| 4,419,202 | 12/1983 | Gibson | 204/192.16 |
| 4,526,802 | 7/1985 | Sato | 204/192.31 X |
| 4,720,918 | 1/1988 | Curry et al. | 30/346.53 |

OTHER PUBLICATIONS

International Search Report PCT-US87/00162, Apr. 1, 1987 (2 pages).

Primary Examiner—Nam X. Nguyen
Attorney, Agent, or Firm—John P. Morley

[57] ABSTRACT

A method of making a cutting edge, which comprises coating a substrate cutting edge having a defined cross-sectional geometry, with a material which is harder than the material of the substrate cutting edge by a vapor deposition or sputtering process, if necessary in the presence of gaseous or vaporized molecules of another element or a compound of another element where it is desired to form the coating of a compound, at a pressure of less than $10^{-2}$ m bar, while simultaneously subjecting the cutting edge to ion bombardment with ions of sufficient mass and energy to cause sputter removal of the deposited material at a rate which is less than the rate of deposition, whereby a cutting edge formed of the deposited material and having a defined cross-sectional geometry and ultimate tip radius, is obtained.

5 Claims, 3 Drawing Sheets

FORMATION OF HARD COATINGS ON CUTTING EDGES

This application is a continuation, of application Ser. No. 122,334, filed as PCT US87/00162 on Jan. 20, 1987, published as WO87/04471 on Jul. 30, 1987, now abandoned.

This invention is concerned with the formation of hard coatings on cutting edges, particularly those of razor blades, and with the coated cutting edges so obtained.

Theoretical studies and experimental work carried out by us have shown that the shaving performance of razor blades would be significantly improved if the thickness of the cutting edge over a distance back from the ultimate tip was substantially less than that of currently available razor blades. (For the avoidance of doubt the term "cutting edge" is used in this specification to refer to the whole marginal zone of a razor blade which is bounded by tapering surfaces or, in everyday parlance, is sharpened, while "ultimate tip" is used to refer to the final edge or tip of the razor blade; in conventional razor blades, the cutting edge extends a some 400–450 $\mu$m back from the ultimate tip). The minimum thickness of the cutting edge for up to 25 $\mu$m back from the ultimate tip is determined by the nature of the blade material. For the steels which are currently used, the blade needs to be at least 0.7 $\mu$m thick at a distance of 1 $\mu$m from the blade tip in order to have sufficient strength to avoid unacceptable levels of shaving damage. On the other hand, if this part of the blade were formed of titanium carbide the blade would only need to be about 0.5 $\mu$m thick at a distance of 1 $\mu$m from the blade tip, or if formed of boron nitride, only about 0.3 $\mu$m thick.

We have determined that in the case of stainless steel razor blades, the improvement in shaving performance referred to above is obtained if the cross-sectional shape of the cutting edge up to a distance of 40 $\mu$m from the ultimate tip is defined by the equation:

$$w = ad^n$$

where w is the tip width in $\mu$m of the cutting edge at a distance d in $\mu$m from the ultimate tip, a is a factor of proportionality of greater than 0 and up to 1 and n is an exponent having a value in the range 0.65 to 0.75. Razor blades having cutting edges of this character are described in our British Specification 2130955A. It is stated in that specification that blades made from or coated with materials harder than stainless steel, such as sapphire, titanium carbide or diamond, can be substantially thinner than stainless steel blades and modified formulae for the cross-sectional shapes of the cutting edges of such blades are given.

Specification 2130955A describes the formation of the cutting edge shapes therein described in stainless steel razor blades, but does not describe the manufacture of the thinner cutting edges which are obtainable with harder materials. The present invention is concerned with a method of forming such cutting edges by coating a pre-existing cutting edge (the substrate cutting edge) formed of steel or another material with a material harder, that is a material having a greater yield strength, or fracture strength, as appropriate for a more brittle material, than the material of the substrate cutting edge.

According to the present invention there is provided a method of making a cutting edge, which comprises coating the substrate cutting edge having a suitable cross-sectional geometry which is such that:

$$w \leq ad^n$$

where w is the tip width in $\mu$m of the cutting edge at a distance d in $\mu$m from the ultimate tip, a is a factor of proportionality of greater than 0 and up to 1 whose value is characteristic of the particular material of the substrate, and n is an exponent having a value in the range 0.65 to 0.75, with a material which is harder (i.e. has a higher yield strength) than the material of the substrate cutting edge by a vapor deposition or sputtering process, if necessary in the presence of gaseous or vaporized molecules of another element or a compound of another element where it is desired to form the coating of a compound, at a pressure of less than $10^{-2}$m bar, while simultaneously subjecting the cutting edge to ion bombardment with ions of sufficient mass and energy to cause sputter removal of the deposited material at a rate which is less than the rate of deposition, whereby a cutting edge formed of the deposited material and having a cross-sectional geometry defined by the equation:

$$ad^n \geq w \geq \frac{1}{\sqrt{m}} ad^n$$

and $$w^3 \geq (w - 2f)a^2d^{2n}$$

where w, d, a and n have the above-stated meanings, m is the ratio of the yield strength of the deposited coating material to that of the substrate material, and f is the thickness in $\mu$m of the deposited coating at the distance d from the ultimate tip, and an ultimate tip radius of less than 500 Å is obtained.

In the following description, reference will be made to the accompanying drawings, in which.

Figure 1:
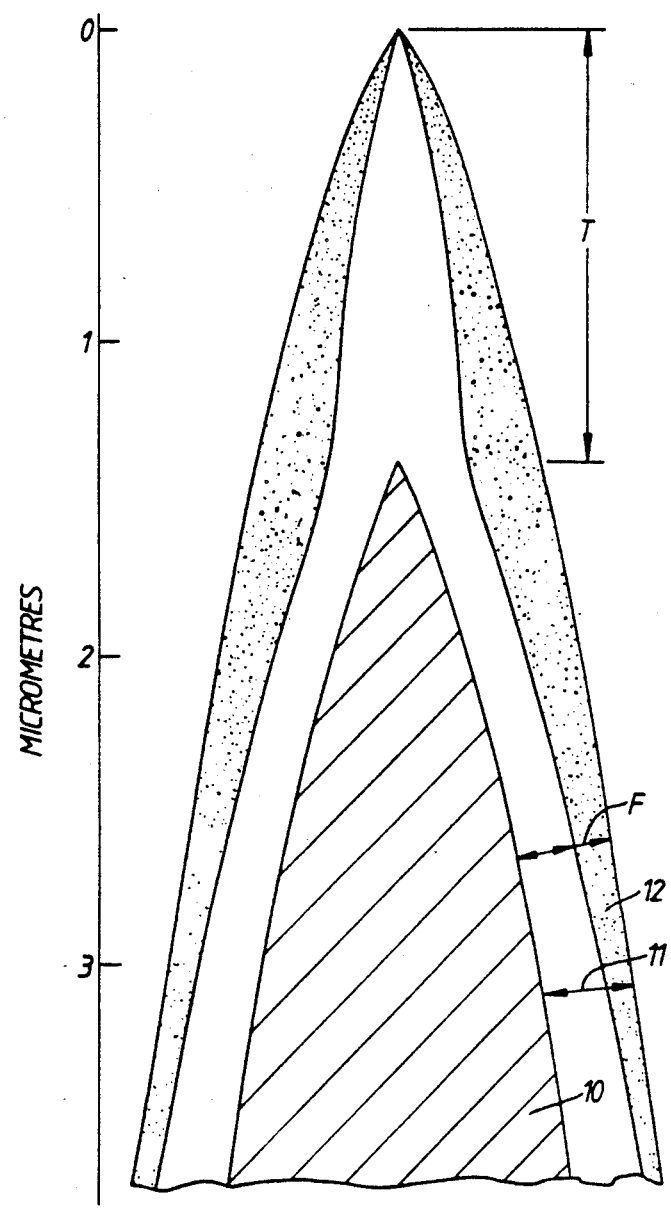
FIG. 1 is a cross-section of a range of embodiments of coated cutting edges for a particular substrate and a coating material about four times as hard as the substrate material, obtained by the method of the invention.

The general form of a coated cutting edge obtained by the method of the invention is shown in FIG. 1; this shows a substrate cutting edge 10 and a coating of the harder material 11 which is approximately four times as hard as the substrate material. A combination of substrate material and coating material meeting this requirement is, for example, steel/TiN. The range of thicknesses of the coating material 11 within the scope of the invention, for the particular substrate cutting edge 10 shown, is indicated by the shaded area 12. Typical dimensions of the portion of the coated cutting edge adjacent the ultimate tip are indicated by the scale on the left hand side of the Figure which is in micrometers.

As shown in FIG. 1, the minimum thickness of coating material 11 is about 0.2 $\mu$m (2000 Å) while the maximum thickness of coating material 11 is about 0.3 $\mu$m (3000 Å).

It would be understood that the geometry of the coated cutting edge and the range of thicknesses of the coating material would be different for other combinations of substrate material and coating material, that is combinations in which the ratio of the hardness of the coating material to that of the substrate material is other than four.

We have stated above that the substrate cutting edge should have a suitable cross-sectional geometry which is such that w is equal to or less than $ad^n$. The obtaining of a product coated cutting edge which has the desired cross-sectional geometry (that is as defined by the above formulae and by the specified ultimate tip radius) is dependent not only on the process conditions used, but also on the use of appropriate substrate cutting edges and coating materials. For a given substrate material and geometry, the harder the coating material, the narrower will be the final cross-sectional geometry. The preferred geometry of the coated cutting edge, with a given coating, is that with the narrowest possible tip cross-section; it follows that this will be achieved using the hardest coating material deposited in the thickest possible form within the constraints imposed by the equations set out above.

In order to obtain the desired geometry of the final coated cutting edge, we have found that it is necessary for the coating to have an aspect ratio of from 1 to 10, preferably from 2 to 8, the aspect ratio being the thickness of the coating on the ultimate tip of the substrate, T, divided by the thickness of the coating on the facets of the cutting edge, F, that is T/F. For example, the aspect ratio of the coating shown in FIG. 1 ranges from 4.5 for the thickest coating 11 to 6.8 for the thinnest.

Figure 2:
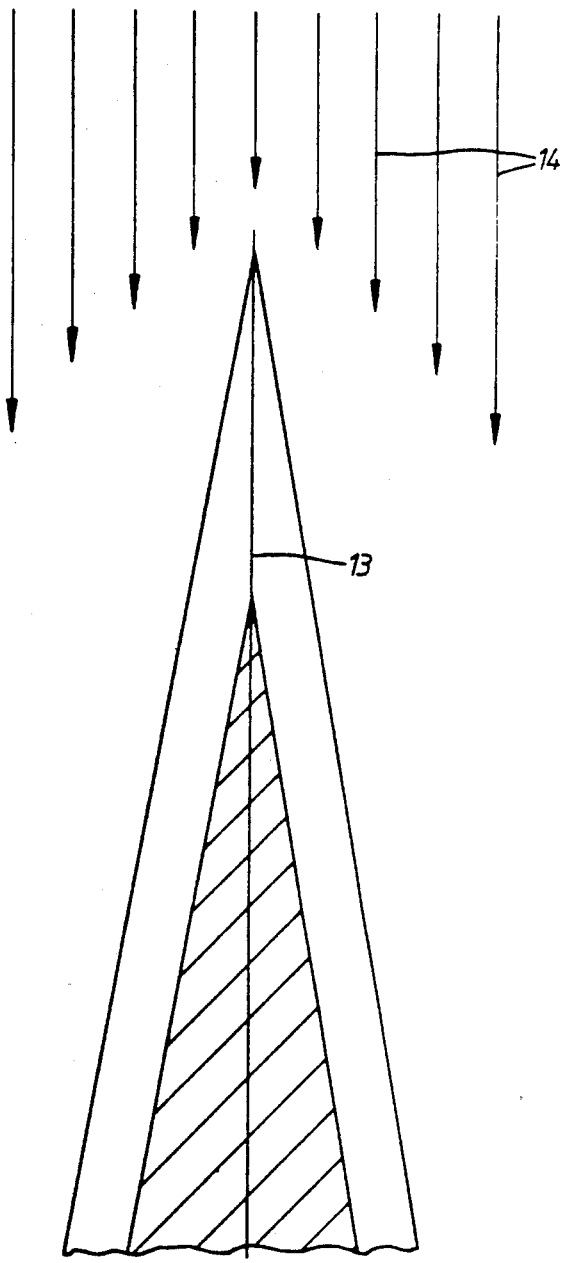
FIG. 2 is a diagrammatic representation generally similar to FIG. 1 illustrating a particular feature of the invention.

To obtain such an aspect ratio it is necessary that the molecular species which are deposited on the substrate cutting edge should be directed at it along paths which are parallel to the central plane of the substrate as shown in FIG. 2 in which the central plane of the substrate is indicated at 13 and the paths of the deposited molecular species at 14. This type of deposition may be referred to as "line of sight" deposition. It can only be obtained if the mean free path of the depositing molecules in the deposition chamber, that is the average distance they travel before one such molecule collides with another is greater than the distance between their source and the substrate to be coated. This in term requires that the deposition be carried out at a pressure which is sufficiently low to obtain a sufficiently large mean free path. For the deposition procedures and apparatus suitable for carrying out the method of the invention, this means, in practice, that the method of the invention must be carried out at a pressure of less than $10^{-2}$m bar, preferably less than $10^{-3}$m bar.

Figure 3:
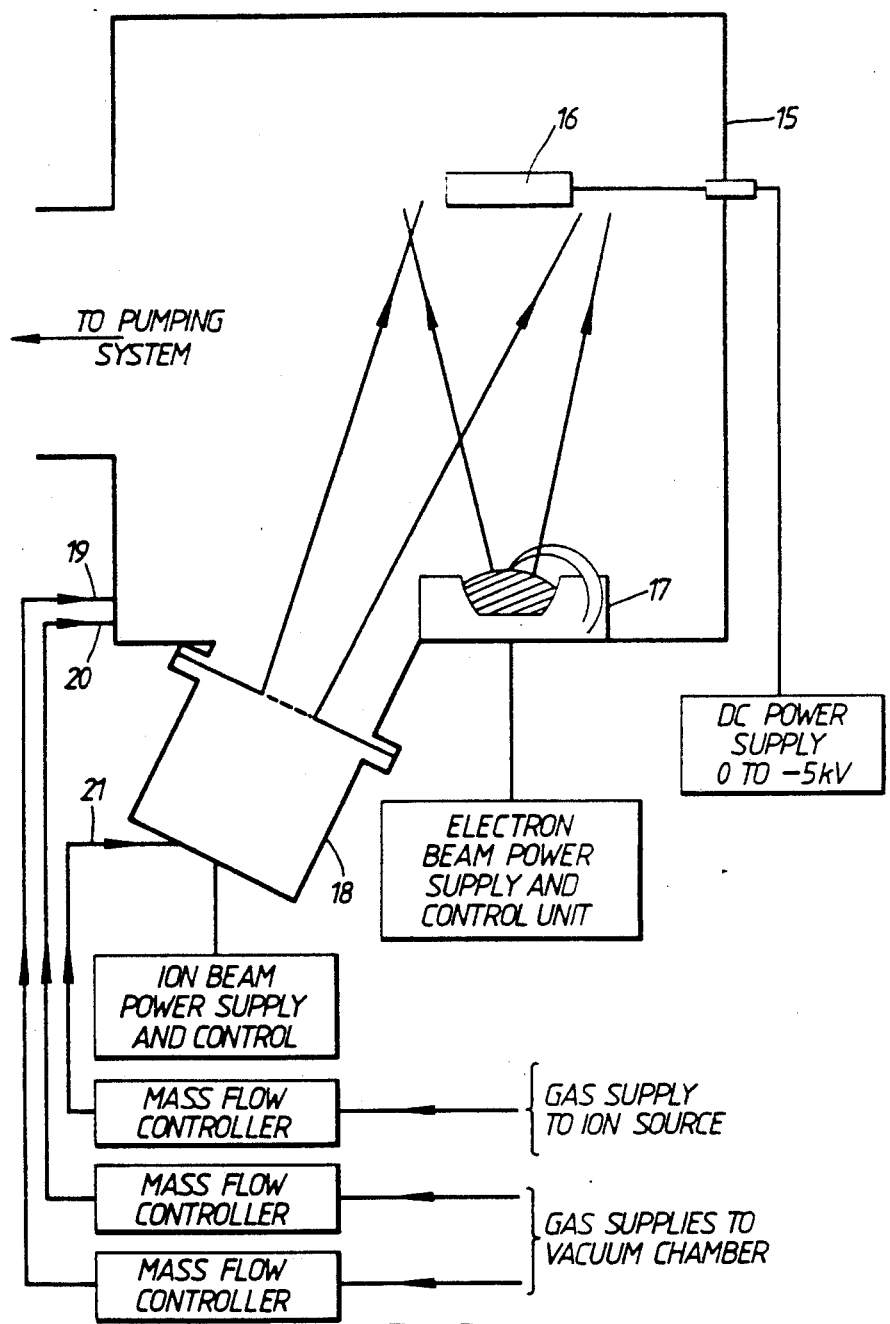
FIG. 3 is a diagrammatic representation of preferred apparatus for carrying out the method according to the invention.

Preferred apparatus for carrying out the method according to the invention is shown diagrammatically in FIG. 3. The apparatus comprises a sealable vacuum chamber 15 connected to a vacuum pumping system (not shown) which is capable of pumping down to the necessary low pressure. The chamber contains a holder 16 for the substrate razor blades which preferably takes the form of a water cooled knife. The holder 16 is electrically connected to a DC power supply which can be adjusted from 0 to $-5$ kV so as to provide negative bias. Within the chamber 15 is an electron beam evaporator 17 for generating a supply of vaporized coating material (or a constituent part of the coating material where the coating is a compound) and an ion source 18 for the bombarding ions.

The vacuum chamber 15 is provided with gas inlets 19 and 20 and the ion source is provided with a gas inlet 21 whereby the chamber and the ion source may be separately supplied with desired gases. Each of the gas supplies is separately controlled by a mass flow controller. This arrangement enables the chamber pressure and the gas composition to be very precisely controlled.

The electron beam evaporator and the ion source may be any suitable commercially available unit.

Although it is preferred to vaporize the coating material (or a constituent thereof) by electron beam evaporation, this is not the only way such vaporization may be effected. Other procedures that may be used include, for example, any other form of thermal evaporation or sputtering. The use of any such other procedures will, of course, require suitable modification of the apparatus.

The bombarding ions used in the method of the invention may be inert to the deposited material or reactive therewith, the former normally being preferred. The current density of the ion bombardment must cause a suitable rate of sputter removal from the deposit, that is a rate of removal which is less than the rate of deposition (so that there is net deposition), but which is sufficient to obtain the desired shape in the final coated cutting edge.

A further important function of the ion bombardment is to refine the microstructure of the deposited material. In the absence of such ion bombardment, certain deposited materials are laid down with a columnar microstructure which is inherently weak so that the coating tends to fracture along the grain boundaries adjacent to the tip of the substrate cutting edge. The use of the ion bombardment simultaneously with deposition of the coating prevents this undesirable microstructure being formed.

The mass and energy requirements of ion bombardment to ensure such refining of the microstructure are generally less than those required of the ion bombardment in order to obtain the desired shape of the coated cutting edge so that if the latter requirement is met, it can generally be taken that the former requirement will be met.

In the light of the foregoing it will be apparent that suitable current densities for the ion bombardment will depend on the mass of the bombarding ions and the nature of the deposited material and numerical limits cannot, therefore, be stated.

The power density of the ion bombardment should not be so high that thermal degradation of the substrate material, in particular the yield strength of the latter, takes place, but should, in principle, be as high as possible subject to this limitation so that processing time is minimized.

It is generally preferred to use inert gas ions, more preferably argon ions, as the bombarding ions, but other ions which can be used include, for example, nitrogen and oxygen.

The substrate cutting edge is preferably formed of steel, preferably stainless steel, but other materials that may be used include, for example, other refractory metals and their alloys, ceramics, glasses and polymers.

Suitable coating materials include, for example, metal oxides, nitrides, carbides and borides, and mixtures of a metal and an oxide, nitride or carbide thereof. Preferred coating materials include, for example, alumina (sapphire), tungsten carbide, titanium nitride, boron nitride, and mixtures of boron and boron nitride.

Nitride coatings, for example TiN and BN, are preferably formed by electron beam evaporation or sputtering of the metal, for example titanium or boron, with nitrogen present in the deposition chamber in an amount required for the coating to be formed of the desired metal nitride. Coatings consisting of a mixture of such a nitride and the corresponding metal, such as a coating of boron containing 10% by weight of boron nitride, are also of interest. These coatings may be obtained by restricting the amount of nitrogen present in the chamber to that required to give the desired conversion of the deposited metal to its nitride.

The boron/boron nitride mixture referred to above has a Vickers hardness of 4200 kg/mm$^2$ and is thus considerably harder than titanium nitride which has a Vickers hardness of 2000 kg/mm$^2$.

Carbide coatings, for example TiC, are preferably formed in a similar way, but with a vaporized hydrocarbon present in place of nitrogen, the amount of hydrocarbon being sufficient to provide the amount of carbon to form the desired carbide.

Oxide coatings, for example $Al_2O_3$, are preferably evaporated directly, but may be formed in a similar way, but with oxygen present in place of nitrogen and the amount of oxygen being sufficient to provide the amount required to form the desired oxide.

A further coating material which may be used is diamond-like carbon (DLC), but the formation of coatings of this material requires some modification of the method according to the invention. Since this material consist of carbon alone, it is not necessary to vaporize the coating material by one or other of the procedures described above and it is only necessary to introduce a gaseous or vaporized hydrocarbon directly into the vacuum chamber or via the ion source. Suitable hydrocarbons include, for example, methane, butane, propane and acetylene. The ion bombardment is, of course, carried out as described for other coating materials. In addition an RF glow discharge may be used in the deposition chamber to form the diamond-like carbon while simultaneously bombarding with an ion beam.

Although we have referred above to coatings formed of single compounds or mixtures, coatings of two or more different materials (that is, multilayer coatings) may be formed by the method according to the invention. The formation of coatings in two more layers is primarily of interest when the outer or final coating does not have the desired adhesion to the substrate cutting edge. In such cases, a first coating is formed of a material which has good adhesion to the substrate and to which the desired outer coating has good adhesion, and the outer coating is then formed. By way of example, the boron/boron nitride mixture referred to above has much better adhesion to the substrate when the latter is first coated with titanium nitride then when the boron/boron nitride mixture is coated directly on to the stainless steel. A further example is the improved adhesion of diamond-like carbon when deposited with an interlayer of a metal such as chromium or titanium.

In order that the invention may be more fully understood, the following examples are given by way of illustration only:

EXAMPLE

The apparatus used was as described above with reference to FIG. 3. The electron beam evaporator was a 10 kW Electrotech ET15 unit and the ion source was a 2.5 cm Kaufman Ion Source. The substrate holder was positioned 300 mm above the ion source. At this distance from the source, the beam had a diameter of 100 mm allowing a maximum current density of 1.25 mA/cm$^2$. The energy of the ions could be varied up to 1.5 kV at the ion source and, in addition, the substrate holder could be negatively biased to $-5$ kV giving an overall range of ion energy from 0 to 6.5 kV.

The substrate blades were stainless steel blades having pre-formed cutting edges having a tip width complying with the formula $w \leq ad^n$, where a is the factor of proportionality appropriate to stainless steel, i.e. about 0.7.

Titanium nitride coatings were formed on the cutting edges of these blades by evaporating titanium in the electron beam evaporator with sufficient nitrogen present in the chamber so that the deposited coating was formed entirely of titanium nitride. The bombarding ions were argon and the pressure in the chamber was $9 \times 10^{-4}$m bar.

A series of runs was carried out using a constant bombarding ion energy of 1.5 kV and with a constant beam current of 50 mA, giving a current density of 0.4 mA/cm$^2$, but using substrate bias voltages as follows:

| | |
|---|---|
| Run A | 0 |
| Run B | 1.5 kV |
| Run C | 2.5 kV |
| Run D | 4.0 lV |

The tip dimensions were measured on the coated blades using the technique described in our Specification 2130955A, and the coating thickness determined from photomicrographs of the cutting edge after it had been fractured in cross-section to show the form of the coating. From all these measurements, values of a, n, and f were calculated and the results examined to ascertain whether or not the shape criteria for the coated edge had been achieved, as follows:

| Tip: facet aspect ratio between 1 and 10 | $w \leq ad^n$ | $w \geq \frac{1}{\sqrt{m}} ad^n$ | $w^3 \geq (w - 2f)a^2d^{2n}$ | |
|---|---|---|---|---|
| Run A | Yes | No | Yes | Yes |
| Run B | Yes | No | Yes | Yes |
| Run C | Yes | No | Yes | Yes |
| Run D | Yes | Yes | Yes | Yes |

From these results, Runs A, B and C produced blades which were not in accordance with the invention; the coated blades from Run D were in accordance with the invention.

We claim:

1. A method for making a cutting edge which comprises the steps of:
   a. selecting a cutting edge substrate having a cross-sectional shape up to a distance of forty micrometers from the extreme edge which is defined by the equation:

$w \leq ad^n$ where w is the tip width in $\mu$m of the cutting edge at distance d from the ultimate tip, a is a factor of proportionality of greater than 0 and up to about 1, and n is an exponent having a value in the range of 0.65 to 0.75.

b. coating the selected cutting edge substrate with a material which is harder than the material of the substrate coating edge by a vapor deposition or sputtering process at a pressure of less than about $10^{-3}$ m bar, said coating step optionally including the presence of gaseous or vaporized molecules of another element or compound of another element, and c. simultaneously subjecting the selected cutting edge substrate to ion bombardment with ions of sufficient mass and energy to cause sputter removal of the deposited material at a rate which is less than the rate of deposition to provide a cutting edge formed of the deposited material and having a cross-sectional geometry defined by the equations:

$$ad^n \geq w \geq \frac{1}{\sqrt{m}} ad^n$$

and $$w^3 \geq (w - 2f)a^2 d^{2n}$$

where w, d, a and n have the above-stated meanings, m is the ratio of the yield strength of the deposited coated material to that of the substrate material, and f is between about 0.2 µm to about 0.3 µm, said edge having an ultimate tip radius of less than 500 Å, and where the aspect ratio of the coating is between about 4.5 to about 6.8.

2. A method according to claim 1, in which the pressure is less than $10^{-4}$ m bar.

3. A method according to claim 1, in which ion bombardment is effected with inert gas ions.

4. A method according to claim 1, in which the coating is formed of a metal oxide, nitride, carbide or boride, or of a mixture of a metal and an oxide, nitride or carbide thereof or of a diamond-like carbon.

5. A method according to claim 4, in which the coating is formed of alumina, tungsten carbide, titanium nitride, boron nitride, or a mixture of boron and boron nitride.

* * * * *